United States Patent
Chen et al.

(10) Patent No.: US 8,174,898 B2
(45) Date of Patent: *May 8, 2012

(54) SENSE AMPLIFIER AND DATA SENSING METHOD THEREOF

(75) Inventors: Chung-Kuang Chen, Pan Chiao (TW); Yi-Te Shih, Zhubei (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 142 days.

This patent is subject to a terminal disclaimer.

(21) Appl. No.: 12/726,542

(22) Filed: Mar. 18, 2010

(65) Prior Publication Data

US 2010/0182842 A1    Jul. 22, 2010

Related U.S. Application Data

(63) Continuation of application No. 12/114,855, filed on May 5, 2008, now Pat. No. 7,710,782.

(51) Int. Cl.
*G11C 11/34* (2006.01)
*G11C 7/02* (2006.01)

(52) U.S. Cl. ................... 365/185.21; 365/207
(58) Field of Classification Search ............. 365/185.21, 365/185.2, 207
See application file for complete search history.

(56) References Cited

U.S. PATENT DOCUMENTS

| | | | |
|---|---|---|---|
| 5,530,671 A | 6/1996 | Hashimoto | |
| 5,729,492 A | 3/1998 | Campardo | |
| 6,219,290 B1 * | 4/2001 | Chang et al. | 365/207 |
| 6,747,892 B2 | 6/2004 | Khalid | |
| 6,996,010 B2 * | 2/2006 | Briner | 365/185.21 |
| 7,312,641 B2 | 12/2007 | Akaogi et al. | |

* cited by examiner

*Primary Examiner* — Anh Phung
(74) *Attorney, Agent, or Firm* — Thomas|Kayden

(57) ABSTRACT

A data sensing method for sensing data stored in first and second memory cells includes the steps of: setting a first voltage according to a bit-line voltage corresponding to the first memory cell in response to an enabled level of a first clock signal; providing the first voltage as a sensing voltage in response to a disabled level of the first clock signal; comparing the sensing voltage with a reference voltage to generate a first output voltage; setting a second voltage according to a bit-line voltage corresponding to the second memory cell in response to an enabled level of a second clock signal, a phase difference between the first and second clock signals being 180 degrees; providing the second voltage as the sensing voltage in response to a disabled level of the second clock signal; and comparing the sensing voltage with the reference voltage to generate a second output voltage.

13 Claims, 6 Drawing Sheets

| Compare the sensing voltage (=voltage Vx1) with the reference voltage Vr to generate the output voltage Vs | ~(c) |

↓

| Sample and temporarily store the output voltage Vs in response to the driving edge of the sampling clock signal CLK_S | ~(g) |

FIG. 5B

| Compare the sensing voltage (=voltage Vx2) with the reference voltage Vr to generate the output voltage Vs | ~(f) |

↓

| Sample and temporarily store the output voltage Vs in response to the driving edge of the sampling clock signal CLK_S | ~(h) |

FIG. 5C

| Set the reference voltage Vr according to the reference data | ~(i) |

SENSE AMPLIFIER AND DATA SENSING METHOD THEREOF

This is a continuation of U.S. patent application Ser. No. 12/114,855, filed May 5, 2008, now U.S. Pat. No. 7,710,782, issued on May 4, 2010.

BACKGROUND OF THE INVENTION

1. Field of the Invention

The invention relates in general to a sense amplifier, and more particularly to a sense amplifier with a shortened voltage sensing time.

2. Description of the Related Art

In the modern age having the technology changing with each passing day, a non-volatile memory, such as a flash, is widely used in various electronic products. Conventionally, when recorded data stored in a memory cell of the flash is to be read, the memory cell in a flash array is biased through a column decoder and a row decoder so that the memory cell generates a sensing current. Thereafter, a sense amplifier detects the sensing current to judge data values stored in the memory cell.

As the technology is gradually developed, the requirement of the access speed for the flash in the market is getting higher and higher. Therefore, it is one of the important subjects in the industry to develop the technique capable of effectively increasing the data sensing speed of the sense amplifier.

SUMMARY OF THE INVENTION

The invention is directed to a sense amplifier and a data sensing method thereof, wherein the sense amplifier of the invention has the advantage of the higher data sensing speed than that of the conventional sense amplifier.

According to a first aspect of the present invention, a sense amplifier for sensing data stored in a first memory cell and a second memory cell of a memory is provided. The sense amplifier includes a reference level setting circuit, a comparator circuit, a latch circuit, first and second level setting circuits, and a switch circuit. The reference level setting circuit sets a reference voltage according to reference data. The comparator circuit compares a sensing voltage with the reference voltage to correspondingly generate an output voltage. The latch circuit samples and temporarily stores the output voltage in response to a driving edge of a sampling clock signal. The first level setting circuit sets a first voltage according to a first bit-line voltage corresponding to the first memory cell in response to an enabled level of a first clock signal. The second level setting circuit sets a second voltage according to a second bit-line voltage corresponding to the second memory cell in response to an enabled level of a second clock signal. The switch circuit provides the first voltage as the sensing voltage in response to the first clock signal and provides the second voltage as the sensing voltage in response to the second clock signal, respectively.

According to a second aspect of the present invention, a data sensing method for sensing data stored in a first memory cell and a second memory cell of a memory is provided. The data sensing method includes the following steps. First, a first voltage is set according to a first bit-line voltage corresponding to the first memory cell in response to an enabled level of a first clock signal. Next, the first voltage is provided as a sensing voltage in response to a disabled level of the first clock signal. Then, the sensing voltage is compared with a reference voltage to correspondingly generate a first output voltage. Next, a second voltage is set according to a second bit-line voltage corresponding to the second memory cell in response to an enabled level of a second clock signal, wherein a phase difference between the first and second clock signals is 180 degrees. Then, the second voltage is provided as the sensing voltage in response to a disabled level of the second clock signal. Next, the sensing voltage is compared with the reference voltage to correspondingly generate a second output voltage.

The invention will become apparent from the following detailed description of the preferred but non-limiting embodiments. The following description is made with reference to the accompanying drawings.

BRIEF DESCRIPTION OF THE DRAWINGS

FIGS. 5B to 5D are partial flow charts showing the data sensing method according to the embodiment of the invention.

DETAILED DESCRIPTION OF THE INVENTION

The sense amplifier of this embodiment sets multiple output voltages according to storage voltages in response to enabled levels of clock signals, and respectively compares the output voltages with a reference voltage in response to disabled levels of these clock signals so as to sense the storage voltages.

Figure 1:
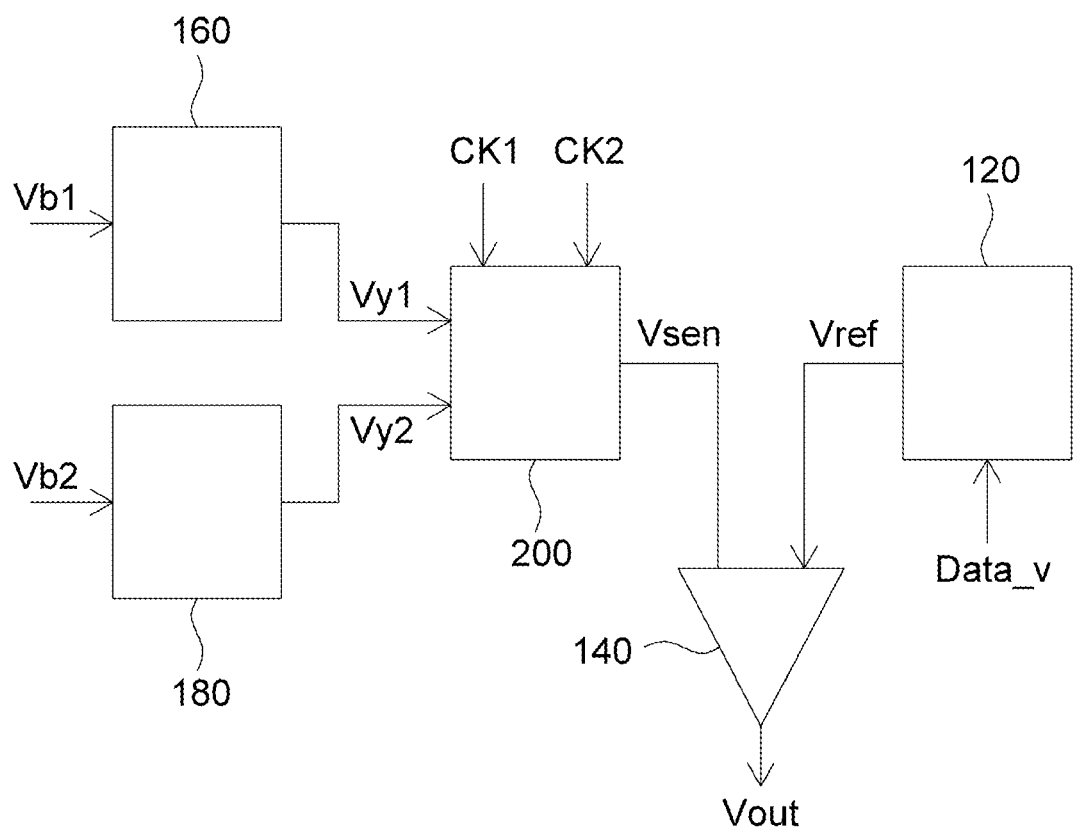
FIG. 1 is a block diagram showing the sense amplifier according to the embodiment of the invention.

FIG. 1 is a block diagram showing the sense amplifier according to the embodiment of the invention. Sense amplifier 100 senses data stored in a first memory cell (not shown) and a second memory cell (not shown) of a memory (not shown). The sense amplifier 100 includes a reference level setting circuit 120, a comparator 140, level setting circuits 160, 180, and a switch circuit 200. The reference level setting circuit 120 sets a reference voltage Vref according to reference data stored in a reference memory cell (not shown). The comparator circuit 140 compares a sensing voltage Vsen with the reference voltage Vref to correspondingly generate an output voltage Vout.

The level setting circuit 160 sets a voltage Vy1 according to a bit-line voltage Vb1 corresponding to the first memory cell in response to a clock signal CK1. The level setting circuit 180 sets a voltage Vy2 according to a bit-line voltage Vb2 corresponding to the second memory cell in response to a clock signal CK2. The phase of the CK2 is different from that of the clock signal CK1. The switch circuit provides the voltage Vy1 as the sensing voltage Vsen in response to the clock signal CK1 and provides the voltage Vy2 as the sensing voltage Vsen in response to the clock signal CK2. Next, example is cited for further detail description for the sense amplifier of the present embodiment of the invention.

Figure 2:
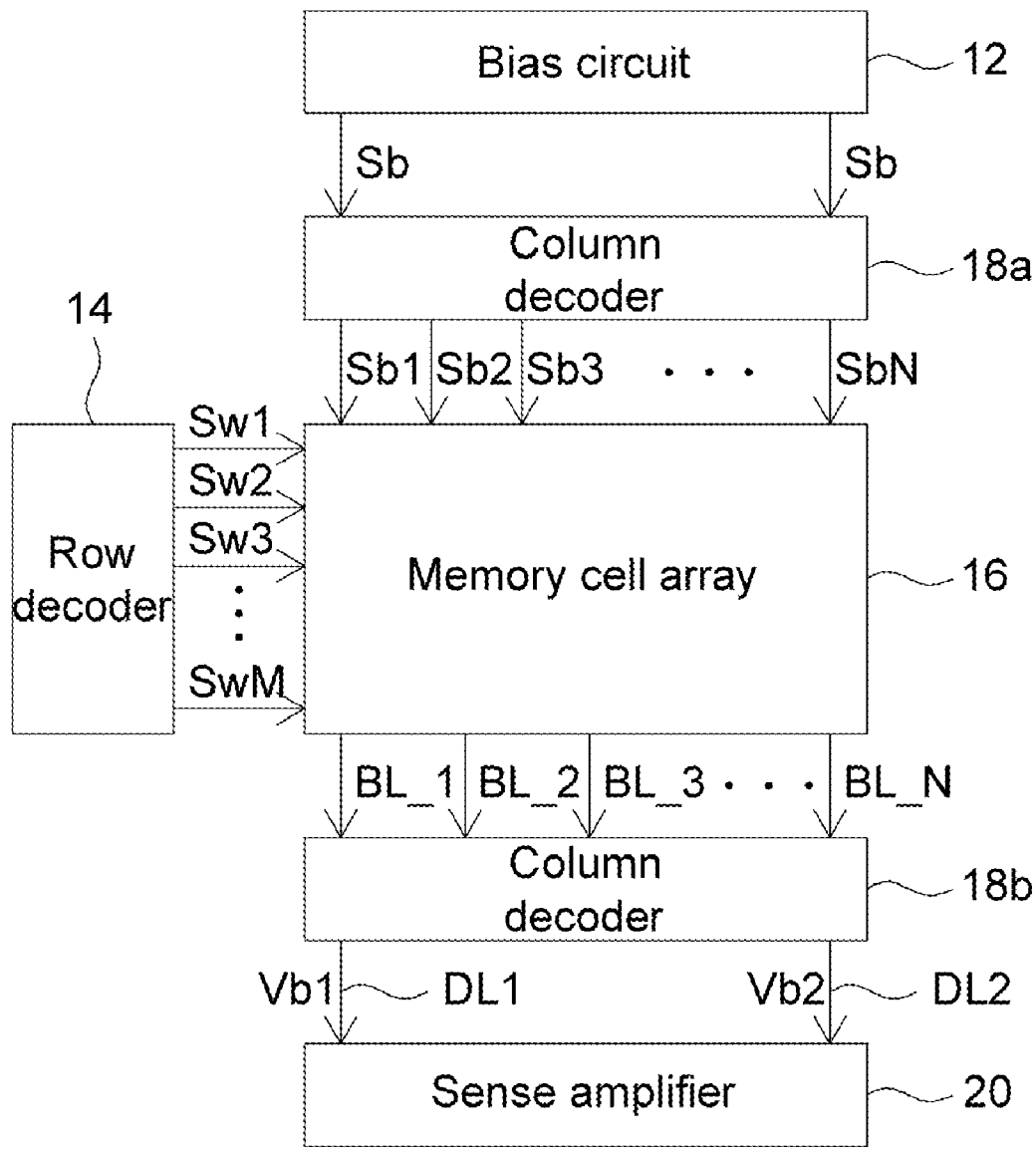
FIG. 2 is a block diagram showing a memory using a sense amplifier according to an embodiment of the invention.

FIG. 2 is a block diagram showing a memory using a sense amplifier according to an embodiment of the invention. Referring to FIG. 2, a flash 10 includes a bias circuit 12, a row decoder 14, a memory cell array 16, column decoders 18a and 18b and a sense amplifier 20. The memory cell array 16 includes many memory cells arranged in an M×N matrix, wherein M and N are natural numbers greater than 1. Each memory cell includes, for example, one transistor having a programmable threshold voltage. Setting a threshold voltage of the transistor can memorize a piece of data into the memory cell. For example, when the threshold voltage of the transistor approaches a first voltage with a higher level, the corresponding storage data recorded in the memory cell is the value 0; and when the threshold voltage of the transistor approaches a second voltage with a lower level, the corresponding storage data recorded in the memory cell is the value 1.

The bias circuit 12 provides a bias signal Sb, and the column decoder 18a provides bias signals Sb1 to SbN to N columns of memory cells of the memory cell array 16 in response to an address signal. The row decoder 14 provides word signals Sw1 to SwM to M rows of memory cells of the memory cell array 16 in response to the address signal. A target memory cell of the memory cell array 16 is controlled, by the corresponding bias signal and word signal, to operate according to the storage data recorded therein, and thus to determine a voltage and a current on a corresponding bit line.

For example, when the storage data recorded in the target memory cell is the value 1, the transistor therein turns on in response to the bias signal and the word signal so that the voltage on the corresponding bit line approaches a high voltage VDD. When the storage data recorded in the target memory cell is the value 0, the transistor therein turns off in response to the bias signal and the word signal so that the voltage on the corresponding bit line approaches a low voltage. In this embodiment, memory cells C(i,j) and C(k,l) of the memory cell array 16 are the target memory cells, which control the voltage Vb1 on the corresponding bit line BL_j in response to the corresponding word signal Swi and bias signal Sbj and control the voltage Vb2 on the corresponding bit line BL_l in response to the corresponding word signal Swk and bias signal Sbl, respectively, wherein i and k are natural numbers smaller than or equal to M, and j and l are natural numbers smaller than or equal to N.

The column decoder 18b provides the voltages Vb1 and Vb2 to the sense amplifier 20. In this embodiment, the column decoder 18b is, for example, a double data line column decoder for providing the voltages Vb1 and Vb2 to the sense amplifier 20 through the data lines DL1 and DL2, respectively.

Figure 3:
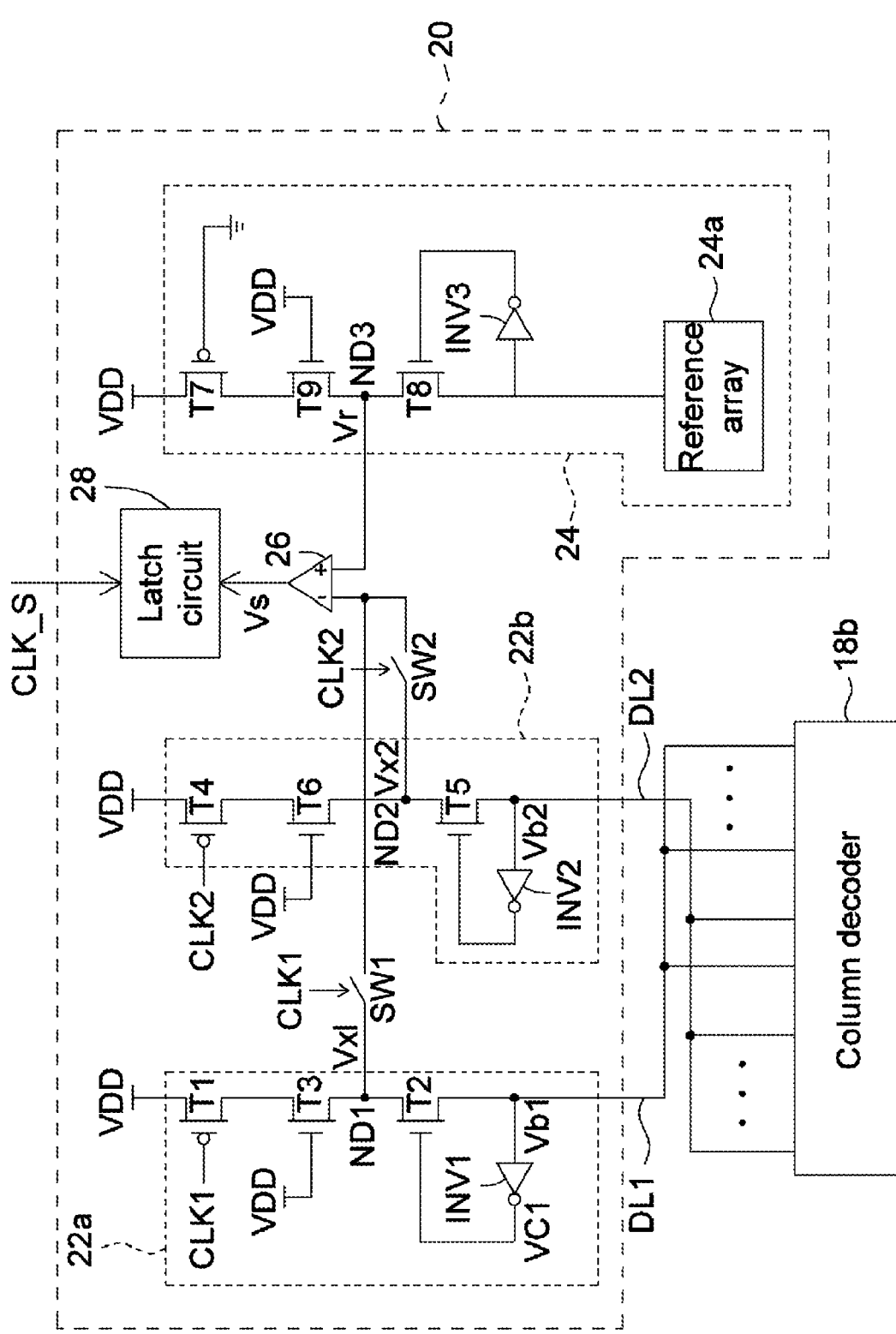
FIG. 3 is a detailed block diagram showing the sense amplifier according to the embodiment of the invention.
Figure 4:
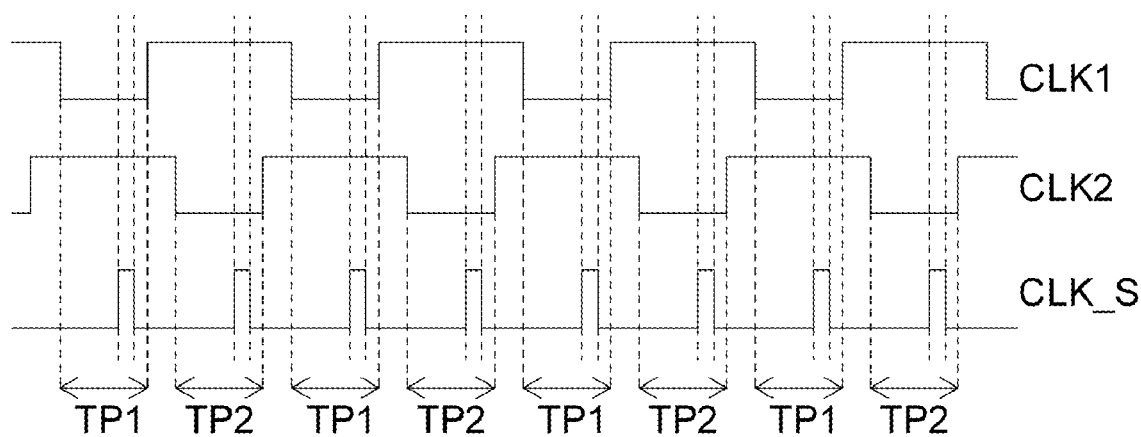
FIG. 4 is a timing chart showing signals associated with the sense amplifier of FIG. 3.

FIG. 3 is a detailed block diagram showing the sense amplifier according to the embodiment of the invention. FIG. 4 is a timing chart showing signals associated with the sense amplifier of FIG. 3. Referring to FIGS. 3 and 4, the sense amplifier 20 includes level setting circuits 22a and 22b, switches SW1 and SW2, a reference level setting circuit 24, a comparator circuit 26 and a latch circuit 28. The level setting circuits 22a and 22b, respectively coupled to the data lines DL1 and DL2, respectively receive the voltages Vb1 and Vb2. The level setting circuits 22a and 22b are further coupled to an input terminal of the comparator circuit 26 through the switches SW1 and SW2. The reference level setting circuit 24 is coupled to the other input terminal of the comparator circuit 26, and the latch circuit 28 is coupled to an output terminal of the comparator circuit.

The level setting circuit 22a includes transistors T1, T2 and T3, a node ND1 and an inverter INV1. The transistor T1 is, for example, a P-type metal oxide semiconductor (PMOS) transistor, which has a source for receiving the high voltage VDD, a drain coupled to a drain of the transistor T3 and a gate for receiving a clock signal CLK1. The transistor T3 is, for example, an N-type metal oxidation semiconductor (NMOS), which has a source coupled to the drain of the transistor T1, a source coupled to the node ND1 and a gate for receiving the high voltage VDD. The transistor T1 turns on in response to an enabled level of the clock signal CLK1 to form a bias circuit together with the transistor T2. The bias circuit biases the voltage Vx1 of the node ND1 such that the voltage of the node ND1 approaches the high voltage VDD. In this embodiment, the enabled level of the clock signal CLK1 is, for example, a low level for enabling the PMOS transistor T1.

The transistor T2 is, for example, an NMOS transistor, which has the drain coupled to the node ND1, a source coupled to the data line DL1 to receive the voltage Vb1, and a gate for receiving a control voltage VC1. The input terminal and the output terminal of the inverter INV1 are respectively coupled to the source and the gate of the transistor T2. The inverter INV1 receives the voltage Vb1 and enables or disables the transistor T2 with the inverted voltage of the voltage Vb1 serving as the control voltage VC1. For example, the voltage Vb1 approaches the high voltage VDD so that the inverter INV1 provides the low-level control voltage VC1 to disable the transistor T2 in response to the voltage Vb1 and thus to make the voltage Vx1 be biased to a level approaching the high voltage VDD. In another example, the voltage Vb1 approaches the low voltage so that the inverter INV1 provides the low-level control voltage VC1 to enable the transistor T2 in response to the voltage Vb1 and the voltage Vx1 is biased to a level approaching the low voltage.

Two input terminals of the switch SW1 are respectively coupled to the node ND1 and a negative input terminal of the comparator circuit 26. The switch SW1 turns on in response to a disabled level of the clock signal CLK1 to provide the voltage Vx1 as a sensing voltage to the negative input terminal of the comparator circuit 26. In this embodiment, the disabled level of the clock signal CLK1 is a high level, for example.

The level setting circuit 22b includes transistors T4, T5 and T6, a node ND2 and an inverter INV2. The transistors T4, T5 and T6 and the inverter INV2 respectively execute the operations similar to those of the transistors T1, T2 and T3 and the inverter INV1 in order to bias the voltage Vx2 of the node ND2 in response to an enabled level of a clock signal CLK2. The switch SW2 executes the operation similar to that of the switch SW1 to turn on in response to a disabled level of the clock signal CLK2 and thus to provide the voltage Vx2 as the sensing voltage to the negative input terminal of the comparator circuit 26. For example, the enabled level of the clock signal CLK2 is equal to a low level, and the disabled level of the clock signal CLK2 is equal to a high level.

The reference level setting circuit 24 includes transistors T7, T8 and T9, a node ND3, an inverter INV3 and a reference array 24a. The reference level setting circuit 24 and the level setting circuit 22a have similar circuit structures except that the reference level setting circuit 24 provides a reference voltage Vr to a positive input terminal of the comparator circuit 26 according to the reference data provided by the reference array 24a.

The comparator circuit 26 compares the voltages, which are respectively received by the negative input terminal and the positive input terminal thereof, with each other to correspondingly generate an output voltage Vs. More specifically, in the time period TP1 when the clock signal CLK1 is low, the switches SW1 and SW2 are respectively enabled and disabled, and the voltage Vx1 is provided as the sensing voltage to the negative input terminal of the comparator circuit 26. Consequently, the comparator circuit 26 compares the voltage Vx1 with the reference voltage Vr to generate the output voltage Vs in the time period TP1.

In the time period TP2 when the clock signal CLK2 is low, the switches SW1 and SW2 are respectively disabled and enabled, and the voltage Vx2 is provided as the sensing voltage to the negative input terminal of the comparator circuit 26. Consequently, the comparator circuit 26 compares the voltage Vx2 with the reference voltage Vr to generate the output voltage Vs in the time period TP2.

The latch circuit 28 samples the output voltage Vs in response to a driving edge of a sampling clock signal CLK_S to temporarily store the output voltage Vs. In this embodiment, the driving edge of the sampling clock signal CLK_S is a rising edge. Reading the output voltage Vs temporarily stored in the latch circuit 28 can effectively sense the storage data memorized in the memory cells C(i,j) and C(k,l).

Figure 5A:
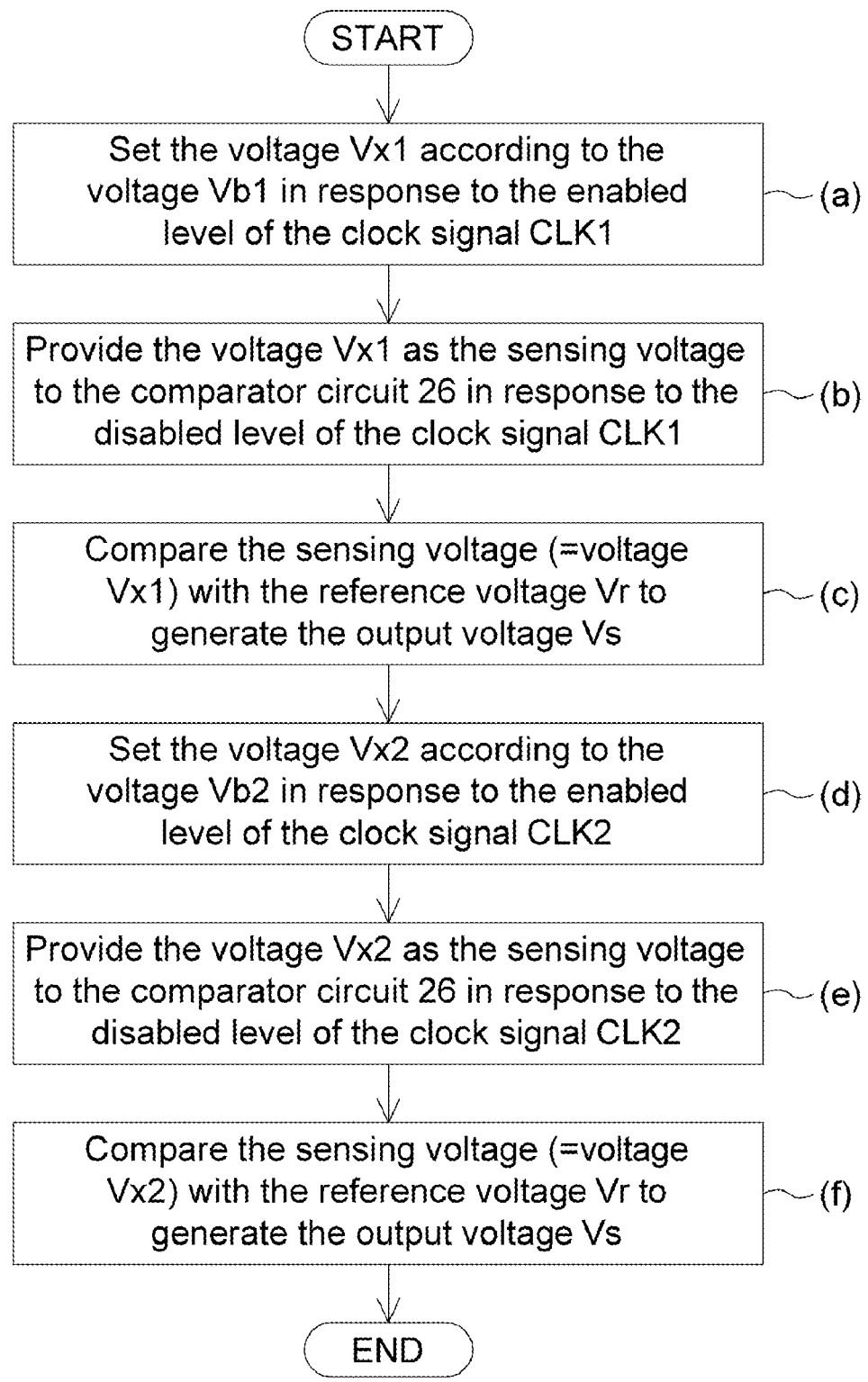
FIG. 5A is a flow chart showing a data sensing method according to the embodiment of the invention.

FIG. 5A is a flow chart showing a data sensing method according to the embodiment of the invention. Referring to FIG. 5A, the data sensing method of this embodiment senses the storage data memorized in the memory cells C(i,j) and C(k,l) of the flash 10. The method includes the following steps. First, as shown in step (a), the level setting circuit 22a sets the voltage Vx1 according to the voltage Vb1 on the bit line BL_j corresponding to the memory cell C(i,j) in response to the enabled level of the clock signal CLK1. Next, as shown in step (b), the switch SW1 outputs the voltage Vx1 as the sensing voltage to the negative input terminal of the comparator circuit 26 in response to the disabled level of the clock signal CLK1. Then, as shown in step (c), the comparator circuit 26 compares the sensing voltage, which is substantially equal to the voltage Vx1, with the reference voltage Vr to correspondingly generate the output voltage Vs.

The data sensing method of this embodiment may further include the step (d), which is executed substantially at the same time when the steps (b) and (c) are executed. In the step (d), the level setting circuit 22b sets the voltage Vx2 according to the voltage Vb2 on the bit line BL_l corresponding to the memory cell C(k,l) in response to the enabled level of the clock signal CLK2, wherein a phase difference between the clock signals CLK1 and CLK2 is equal to 180 degrees.

Next, step (e) is performed. In the step (e), the switch SW2 provides the voltage Vx2 as the sensing voltage in response to the disabled level of the clock signal CLK2. Thereafter, step (f) is performed. In the step (f), the comparator circuit 26 compares the sensing voltage, which is substantially equal to the voltage Vx2, with the reference voltage Vr to correspondingly generate the output voltage Vs.

FIGS. 5B to 5D are partial flow charts showing the data sensing method according to the embodiment of the invention. The data sensing method of this embodiment may further include step (g) after the step (c). In the step (g), the latch circuit 28 samples and temporarily stores the output voltage Vs in response to the driving edge of the sampling clock signal CLK_S.

The data sensing method of this embodiment may further include step (h) after the step (f). In the step (h), the latch circuit 28 samples and temporarily stores the output voltage Vs in response to the driving edge of the sampling clock signal CLK_S.

The data sensing method of this embodiment may further include step (i), in which the reference level setting circuit 24 sets the reference voltage Vr according to the reference data provided by the reference array 24a.

In this embodiment, a duty cycle of each of the first and second clock signals CLK1 and CLK2 at the enabled level (i.e., the high level) is greater than or substantially equal to 50% to prevent the switches SW1 and SW2 from turning on simultaneously and prevent the voltages Vx1 and Vx2 from interfering with each other. In this embodiment, the duty cycle of each of the clock signals CLK1 and CLK2 at the enabled level is substantially equal to 66.7%. However, the duty cycle of each of the clock signals CLK1 and CLK2 is not limited to 66.7% but may be the value greater than or equal to 50%.

In this embodiment, the column decoder for connecting the sense amplifier 20 to the memory cell array 16 is the double data line column decoder 18b. However, the column decoder is not limited thereto. For example, the column decoder may further be a decoding unit including two conventional single data line column decoders, and the sense amplifier 20 performs a sensing operation according to the voltages on the data lines of the two conventional single data line column decoder.

In the sense amplifier of this embodiment, two level setting circuits set the first voltage according to the voltage on the first data line and set the second voltage according to the voltage on the second data line when the first and second clock signals have the enabled levels, respectively. In addition, two switches provide the first and second voltages as the sensing voltages to the negative input terminal of the comparator circuit when the first and second clock signals have the disabled levels, respectively, wherein the phase difference between the first and second clock signals is 180 degrees.

Therefore, one of the two level setting circuits may set the sensing voltage thereof when the other one of the two level setting circuits outputs the corresponding sensing voltage through the switching of two switches. As a result, the sense amplifier of this embodiment may finish the operations of sensing the storage data of two memory cells in one clock cycle of the clock signal. Compared with the conventional sense amplifier, which can only sense the storage data of one memory cell in one clock cycle of the clock signal, the sense amplifier of this embodiment has the advantage of the higher data sensing speed.

In addition, the number of sense amplifiers to be used can be decreased through the sense amplifier of this embodiment in the application of the memory circuit to achieve substantially the same data accessing speed. Consequently, the number of sense amplifier can be advantageously decreased in the memory circuit using the sense amplifier of this embodiment.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A sense amplifier for sensing data stored in a first memory cell and a second memory cell of a memory, the sense amplifier comprising:
   a reference level setting circuit for setting a reference voltage according to reference data;
   a comparator circuit for comparing a sensing voltage with the reference voltage to correspondingly generate an output voltage;
   a first level setting circuit for setting a first voltage according to a first bit-line voltage corresponding to the first memory cell;
   a second level setting circuit for setting a second voltage according to a second bit-line voltage corresponding to the second memory cell; and
   a switch circuit for providing the first voltage as the sensing voltage in response to a first clock signal and providing the second voltage as the sensing voltage in response to a second clock signal, respectively, wherein there is a phase difference between the first and the second clock signals.

2. The sense amplifier according to claim 1, wherein the switch circuit further comprises:
   a first switch comprising a first input end and a second input end respectively coupled to the first level setting circuit for receiving the first voltage and coupled to the comparator circuit; and
   a second switch comprising a first input end and a second input end respectively coupled to the second level setting circuit for receiving the second voltage and coupled to the comparator circuit.

3. The sense amplifier according to claim 1, wherein the first level setting circuit comprises:
   a first node having the first voltage;
   a first transistor, which turns on in response to an enabled level of the first clock signal to make the first voltage approach a high voltage;
   a second transistor having a first source/drain coupled to a first bit line corresponding to the first memory cell to receive the first bit-line voltage, a second source/drain coupled to the first node, and a gate for receiving a first control voltage, wherein the second transistor is controlled, by the first control voltage, to make the first voltage approach a low voltage; and
   an inverter for generating the first control voltage in response to the first bit-line voltage.

4. The sense amplifier according to claim 3, wherein the first level setting circuit further comprises:
   a third transistor for biasing the first voltage in response to the high voltage.

5. The sense amplifier according to claim 1, wherein the second level setting circuit comprises:
   a second node having the second voltage;
   a fourth transistor, which turns on in response to the second clock signal to make the second voltage approach a high voltage;
   a fifth transistor having a first source/drain coupled to a second bit line corresponding to the second memory cell to receive the second bit-line voltage, a second source/drain coupled to the second node, and a gate for receiving a second control voltage, wherein the fifth transistor is controlled, by the second control voltage, to make the second voltage approach the low voltage; and
   an inverter for generating the second control voltage in response to the second bit-line voltage.

6. The sense amplifier according to claim 5, wherein the second level setting circuit further comprises:
   a sixth transistor for biasing the second voltage in response to the high voltage.

7. The sense amplifier according to claim 1, wherein a phase difference between the first clock signal and the second clock signal is 180 degrees.

8. The sense amplifier according to claim 7, wherein a duty cycle of each of the first clock signal and the second clock signal at the enabled level is greater than or substantially equal to 50%.

9. The sense amplifier according to claim 1, wherein the memory comprises a double data line column decoder and the first and the second bit-line voltages received by the sense amplifier are provided from the double data line column decoder.

10. The sense amplifier according to claim 1, wherein the sense amplifier senses the data stored in the first memory cell and the second memory cell in one clock cycle.

11. The sense amplifier according to claim 1, further comprising:
    a latch circuit for sampling and temporarily storing the output voltage in response to a driving edge of a sampling clock signal.

12. A data sensing method for sensing data stored in a first memory cell and a second memory cell of a memory, the data sensing method comprising the steps of:
    (a) setting a first voltage according to a first bit-line voltage corresponding to the first memory cell;
    (b) setting a second voltage according to a second bit-line voltage corresponding to the second memory cell;
    (c) providing the first voltage and the second voltage as a sensing voltage respectively in response to a first clock signal and a second clock signal, wherein there is a phase difference between the first and the second clock signals;
    (d) comparing the sensing voltage with a reference voltage to correspondingly generate an output voltage.

13. The data sensing method according to claim 12, further comprising, after the step (d), the step of:
    (e) sampling and temporarily storing the first output voltage in response to a first driving edge of a sampling clock signal.

* * * * *